United States Patent [19]

Windham, Jr. et al.

[11] Patent Number: 5,277,612

[45] Date of Patent: Jan. 11, 1994

[54] CARRIER FOR GUIDING AND SUPPORTING SEMICONDUCTOR DEVICES

[75] Inventors: Gerald O. Windham, Jr., Madison; Joseph T. Betterton, Arab; Joe D. Johnson, Huntsville, all of Ala.

[73] Assignee: Chrysler Corporation, Highland Park, Mich.

[21] Appl. No.: 871,527

[22] Filed: Apr. 21, 1992

[51] Int. Cl.⁵ .......................................... H01R 13/00
[52] U.S. Cl. ................................... 439/326; 361/760
[58] Field of Search ........................ 439/296, 326–328; 361/400, 405, 412

[56] References Cited

U.S. PATENT DOCUMENTS 3,059,152 10/1962 Khouri .
4,663,695 5/1987 Ohkawara et al. .
4,667,270 5/1987 Yagi .
4,948,953 8/1990 Starck .
4,959,900 10/1990 de Givry et al. .
5,186,651 2/1993 Fuchs et al. .................... 439/326

Primary Examiner—Joseph H. McGlynn
Attorney, Agent, or Firm—Kenneth H. MacLean

[57] ABSTRACT

This carrier for a plurality of transistors or other semiconductor devices comprises a unitized body of plastics material having inclined guide surfaces between adjacent guide walls of laterally spaced positioning blocks extending upwardly from a base of the carrier. These guide surfaces and walls guide the leads of the transistors into laterally spaced openings formed through the carrier base which align with openings in a printed circuit board after the carrier is attached to the board by snap-in fasteners. The transistors are seated and held in an upright and aligned position on the carrier by integral leaf-type springs which bias them against the front walls of the blocks for subsequent handling and wave soldering to the board. In a preferred embodiment, the transistors are seated on the top of the springs so that their installed positions are predetermined by the springs to ensure that there is no contact of the transistor leads with a bottom wall of a metallic housing in which the circuit board is installed. This effectively reduces or eliminates damage to the leads or the electrical shorting thereof.

7 Claims, 2 Drawing Sheets

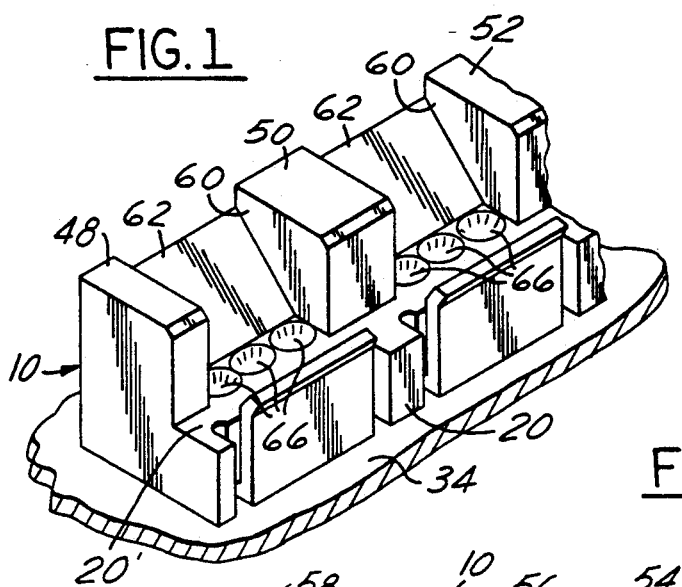
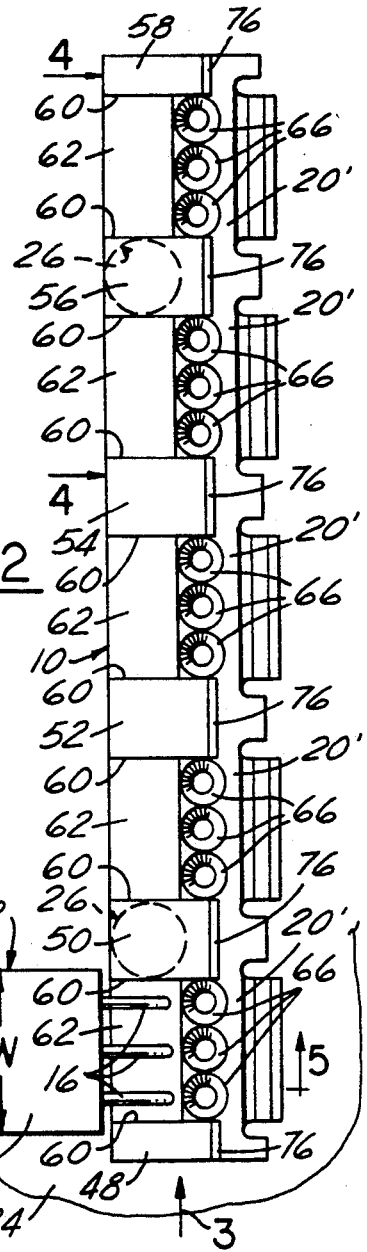
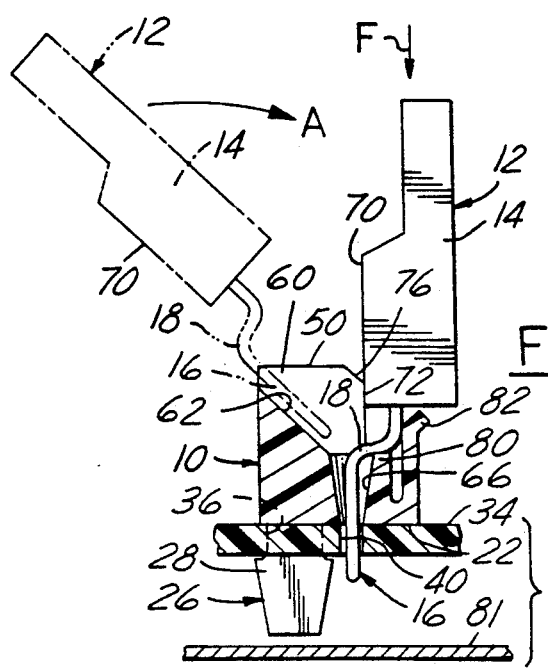
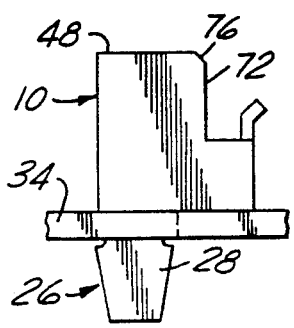

CARRIER FOR GUIDING AND SUPPORTING SEMICONDUCTOR DEVICES

FIELD OF THE INVENTION

The present invention relates to a carrier and positioning device providing new and improved construction facilitating the aligned attachment of transistors, or other types of semiconductor devices, having depending leads to a printed circuit (p c.) board, with precise feeding of the leads into openings in the board.

BACKGROUND OF THE INVENTION

In assembling semiconductor devices, such as transistors, to a printed circuit or p.c. board, various mount constructions have been employed to hold transistors in an upright position on the board with the wire leads thereof inserted into corresponding openings in the board. After this mechanical attachment has been accomplished, the leads are soldered by wave soldering or other suitable processes so that the transistors are electrically and functionally connected to the p.c. board circuitry. While prior transistor support constructions have been generally satisfactory, new and improved carrier constructions and methods of assembly are needed to insure precise alignment and positioning of the transistors and the insertion of their leads into lead holes in the board manually or by automation without lead damage to effect mechanical connection so that they can be subsequently soldered to the board with optimized results. Furthermore, new and improved carrier constructions and methods are needed for precisely mounting transistors to circuit boards so that transistor leads will not contact the metallic housing in which the boards are installed and to position the transistors for effective heat sinking to the housing.

SUMMARY OF THE INVENTION

The present invention is exemplified by preferred embodiments, which provides a new and improved carrier or holder for single or multiple transistors arranged in rank or other pattern. Each transistor preferably has a plastic package with electrical wire leads depending therefrom. The carrier comprises a unitized contoured body molded of plastics material having a base with support surfaces, and having depending locating and locking snap fasteners which can be inserted into corresponding openings in the p. c. board by a downward force exerted on the carrier.

The carrier is an elongated and generally rectilinear unit that has a plurality of laterally spaced upstanding transistor positioning blocks with flattened side walls that face one another and have an inclined guiding surfaces or slides formed therebetween. The facing side of walls of the blocks and the slides provide contact and guiding surfaces for the wire leads of the transistor being mounted, and accurately feed these leads into corresponding funnel like openings in base of the carrier. These openings which may be conical or rectilinear to correspond to the cross sectional shape of the leads and extend completely through the carrier base. The upper lead entrance ends of the openings have diameters or are sized to effect alignment with slide and guide surfaces of the carrier to ensure reception of the semiconductor leads. These guide openings diminish in diameter in rectilinear cross section and guide the leads into appropriate lead openings formed in the p.c. board aligned with the guide openings by the carrier placement on the board.

The leads are dog-legged in side view so that as the semiconductor is installed in the circuit board the lateral extension of the dog-leg contacts a stop surface of the base of the carrier or on the top of a leaf spring, as further described below, to provide a positive stop to seat the transistor in an upright position and limit the downward extension of the leads which may otherwise ground against the lower wall of a metallic housing in which the p.c. board is to be potted. This position is effectively maintained under low load by an integral upstanding leaf spring which is live hinged to the base. The leaf spring has a contact surface that in one embodiment engages an upper portion of the dog-leg leads of the semiconductor package. The light force of this spring urges the package of the transistor against flattened forward faces provided by the separator blocks of the carrier. This spring force is sufficient to hold the semiconductor accurately in position for handling during subsequent soldering operation. This force, however, is light enough to be overcome by the force of a separate metal spring clip used to urge the semiconductor against wall portions of the aluminum housing for the p.c. board for heat sinking purposes.

The design of the carrier of this invention accordingly includes among its features:

a. Two step lead in ramps and tapered holes for easy transistor insertion designed to meet production manual insert rates and engineered to be readily adaptable for robotic transistor installation into printed circuit boards;

b. Integral low load spring to accept and hold transistor products of various suppliers having a wide range of dimensional tolerances in the proper loaded position against fixed stops forming part of the carrier;

c. Positive mechanical stops against the molded semiconductor packages or their leads to insure that there is no semiconductor lead interference with the metallic housing for the printed circuit board, and proper semiconductor height for subsequent potting of the board in the housing; and d. The snap in assembly of the carrier to a printed circuit board enhancing the subsequent positioning of transistors in predetermined positions with respect to the board and to facilitate subsequent heat sinking of the transistors to the housing for the board.

These and other features objects and advantages of this invention will become more apparent from the following description and drawings in which:

BRIEF DESCRIPTION OF THE DRAWINGS

FIG. 1 is a pictorial view of a portion of a transistor carrier attached to a p.c. board with parts broken away illustrating one preferred embodiment of the invention;

FIG. 2 is a top view of the carrier of FIG. 1 but as a complete unit for five transistors and showing one of the transistors being guided into connection with a p.c. board;

FIG. 3 is an end view of the carrier and p.c. board of FIG. 2 as viewed in the direction of the sight arrow 3 but with the transistor removed;

FIG. 4 is a rear view of a portion of the carrier of FIG. 2 as viewed along sight lines 4—4 of FIG. 2;

FIG. 5 is a cross sectional view taken along sight lines 5—5 of FIG. 2 and further showing the installation of the carrier and transistor to a p. c. board;

DETAILED DESCRIPTION

Figure 6:
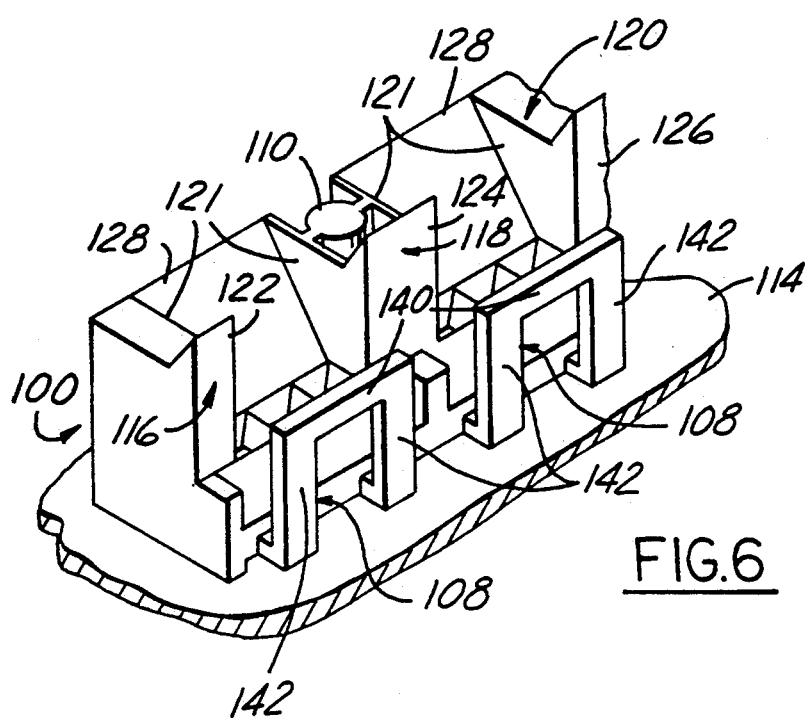
FIG. 6 is a pictorial view of a portion of a transistor carrier similar to that of FIG. 1 but illustrating another preferred embodiment of the invention mounted to a printed circuit board.

Turning now in greater detail to the drawing, there is shown a carrier 10 of suitable plastics material for a plurality of semiconductor devices such as transistor 12 (only one shown). Each transistor has a metal or plastic package 14 with three metallic wire leads 16 extending therefrom. The leads 16 are laterally spaced from one another. As shown in FIG. 5, the leads 16 extend from the lower side of each package 14 but are offset and not straight but dog-legged. The off-set or dog-legged portion of each lead is identified by reference numeral 18.

The carrier 10 comprises a base 20 with a lower surface 22 from which depend a number of locating and locking snap fasteners 26, each having a conical locking head 28 which is centrally split to provide resilient side portions 30, 32 allowing the carrier 10 to be mechanically attached at a predetermined position to a printed circuit board 34. This installation is readily achieved by aligning the snap fasteners 26 with annular openings 36 in the board, and exerting an installation force toward the board so that the side portions of the locking head are cammed inwardly and forced together as the head extends through the opening 36. Subsequently, the sides 30, 32 of the locking head spring apart to lock the carrier in position.

The carrier 10 provides construction which effectively positions and guides the leads 16 of a transistor 12, as shown in FIGS. 2 and 5, into aligned openings 40 formed through the p.c. board 34. The carrier further securely holds the transistors in a predetermined upright position for subsequent handling and soldering operations in which the leads are operatively connected to the runs of board circuitry.

To this end, the carrier 10 has a plurality of laterally and equally spaced transistor positioning blocks 48, 50, 52, 54, 56, and 58 which rise from the base 20 to define pairs of facing flat guide faces 60 for guiding leads 16 into their respective openings. Inclines 62, formed between the blocks, extend from their upper edges 64 to their intersections with the top surface of the base 20 with a slope of 45%, for example.

Formed in the base 20 and tangent to the ends of the inclines 62 are groups of three conical guide openings 66 that have their large-diameter upper end open at the top of the base and tangent to the end of the inclines 62. These openings 66 progressively diminish in diameter until their lower ends align with corresponding openings 40 preformed in the p.c. board.

With this carrier construction, two step ramps are provided for the transistor leads. The transistor leads can be placed on a selected incline 62 and the transistor can be moved in a clockwise and downward direction, as indicated by the installation arrow A of FIG. 5. During this movement the leads enter the second conical guide openings 66 which provide the second step of the two step ramp. When the back face 70 of the transistor package 14 substantially aligns with the forward retainer faces 72 of the laterally spaced blocks 48, 50, the transistor is positioned for connection into the p. c. board.

As shown in FIG. 2, the width W of the transistor package 14 is substantially greater than the distance between the faces 60 of adjacent guide blocks. The forward top edge of each guide block is chamfered at 76 to provide an installation ramp so that the downward displacement of the transistor is not impeded by the top of adjacent blocks during installation. Accordingly, the transistor is turned to an alignment position and with a downward installation force F is then applied and the initial motion of the transistor to the board is completed. In this position the leads 16 extend through the openings 40 in the p.c. board, preferably these openings are coated with a layer of electrically conductive solder material.

In the mechanically installed position, shown in FIG. 5, the dog-legs 18 of the transistor leads rests on the top of a support surface 20' of the base 20 to provide a stop 80 so that the transistor cannot be pushed too far into the board. This prevents the possibility of contact of the leads with a bottom wall 81 of the housing in which the p.c. board is to be subsequently potted. Furthermore, as this stop position is reached, a integral leaf type spring 82, being deflected in a clockwise direction in FIG. 5 by the installation force, provides a light recovery force directed to the upper portion of the leads of the transistor. This force is sufficient to move the transistor in a counter clockwise direction so that the flat face 70 of the transistor engages the forward faces 72 of the blocks, such as blocks 48 and 50, for example. With this construction, the transistors are held in an upright position for subsequent handling and wave soldering to the board. Importantly, the seat and leaf spring provides a wide tolerance range for transistors of varying dimensions which may be supplied from a different sources or even from the same source.

Figure 8:
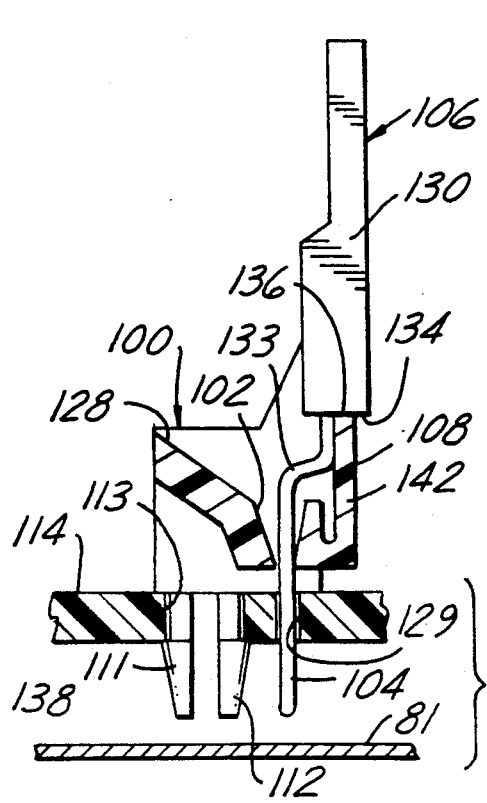
FIG. 8 is a cross-sectional view taken generally along sight lines 8—8 of FIG. 7 but which and further shows a transistor held in upright position by the carrier.
Figure 7:
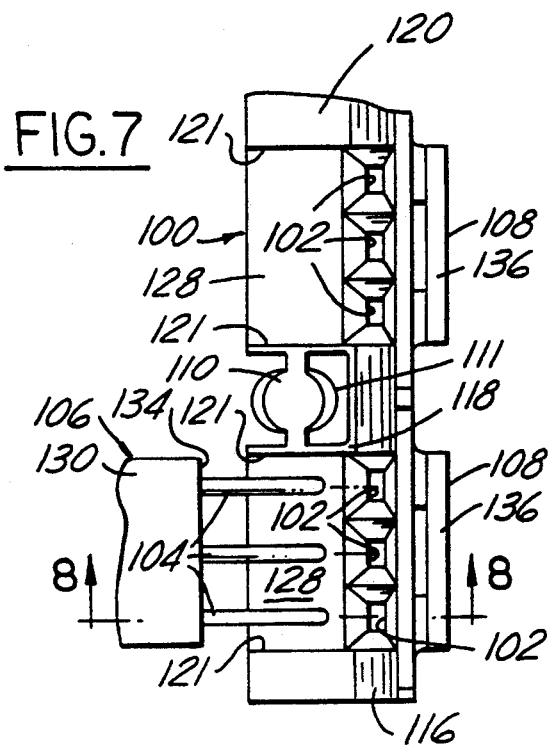
FIG. 7 is top view of a portion of the carrier of FIG. 6 but with a transistor being installed thereon.

FIGS. 6 through 8 illustrate another preferred embodiment of the transistor carrier of this invention evolved from the carrier construction of FIGS. 1 through 5. However, in this preferred embodiment the carrier, identified by reference numeral 100, it has rectilinear hopper-like guide openings 102 for the rectilinear leads 104 of the transistors 106. Additionally, this embodiment has a plurality of leaf type springs 108 cut out as shown in FIG. 6 and connected at their lower ends to a lower forward face of the base of the carrier 100. These springs 108 not only urge the transistors into an aligned and upright position against vertical faces of upstanding stop portions of the carrier, but importantly, serve as a seat for the base of the transistor packages so that the wire leads thereof do not project through the printed circuit board to such an extent that they will abut and short against the bottom wall of the metallic casing, or housing, when the circuit board is installed and potted therein.

More particularly, the carrier 100 is molded or otherwise formed from plastics into the unitized configuration of FIGS. 6, 7 and 8 in which there are a plurality of vertically extending snap-in fasteners 110 the lower ends of which terminate in conical split heads 111 and 112, shown in FIG. 8. These fasteners are adapted to extend through previously formed openings 113 in the printed circuit board 114 and, after insertion therethrough, spring apart to secure the carrier 100 in a predetermined position on the board. The carrier is formed with upstanding rectilinear transistor guide blocks or positioning stops 116, 118, 120 laterally spaced from one another. There are preferably six of these blocks as in the embodiment of FIGS. 1-5. The blocks have flat sides 121 that face one another and forward vertical faces 122, 124 and 126, respectively. These blocks also serve as abutments for positioning the transistors 106 in an aligned and upright position.

Extending between these blocks are inclined surfaces 128 that serve as guides for the three dog-legged rectilinear leads 104 of each associated transistor 106 which accommodate the initial placement of the transistor on the carrier, as shown in FIG. 7. The interfacing sides 121 of adjacent blocks restrict the lateral movement of the transistor as it is being installed in the carrier and thereby aid in the guidance of the leads thereof into rectilinear guide openings 102 and then into aligned openings 129 in the printed circuit board. The rectilinear package 130 of the transistor can be manually grasped and the transistor 106 swung upward so that the transistor package 130 clears the blocks 116 and 118, for example.

After the transistor is clear of these blocks, the dog-legged portions 133 of the leads 104 will enter the rectilinear openings 102. The transistor can then be readily pushed in a downward direction until the bottom or lower surface 134 of the transistor package 130 sits upon the upper surface 136 of the spring 108. As best shown in FIG. 8, this positions the transistor in a predetermined vertical position so that the leads 104 do not extend to such a depth that would engage the bottom surface 81 of the housing 138 in which the circuit board is to be installed. This prevents the bending, braking and shorting of the transistor leads.

In the FIG. 6-8 embodiment, the cross bars 140 extending between the vertical arms 142 of the leaf spring 108 engage the dog-legged portion 133 of the transistor lead 104 to bias the transistor package 130 against the vertical faces 122 and 124 of the guide block. The leaf springs 108 in this embodiment accordingly provides versatile construction for positioning the transistors in a predetermined upright position and also accommodate wide tolerance range of transistor packages so that an increased number of different sized transistors can be used.

While the above description constitutes preferred embodiments of the invention, it will be appreciated that the invention can be modified and varied without departing form the scope of the accompanying claims.

We claim:

1. A carrier for a plurality of semiconductor devices each having a upper package with a plurality of leads extending therefrom, said carrier having locating and locking means associated therewith for attachment to a printed circuit board guiding said leads through lead openings formed in the printed circuit board for subsequent operative connection thereto, said carrier comprising a base portion having lower and upper surfaces and plurality of laterally spaced openings extending from said lower surface to said upper surface, said base portion further having a plurality of laterally spaced springs each having a lower end hinged to said base portion and having a free end portion extending upwardly from said lower end, a plurality of laterally spaced stops extending from said upper surface of said base portion, said stops having laterally spaced sides and inclined guide surface means therebetween, said inclined guide surface means terminating adjacent to said laterally spaced openings at said upper surface in said base portion, said stops having forward contact surfaces for engagement with the packages of said semiconductor devices and arranged so that the leads of a semiconductor device can be guided between said laterally spaced sides and down said guide surface means into said openings for continued guidance thereby into corresponding lead openings in the printed circuit board, said springs being operative to urge the upper package of a semiconductor device being installed in said carrier against said forward contact surfaces of the laterally spaced stops to hold said semiconductor device in a predetermined position on said carrier and on the printed circuit board.

2. The carrier defined in claim 1 and in which the leads of said semiconductor devices are dog-legged and are generally cylindrical, said carrier having a seat for contacting an offset portion of said dog-leg leads and in which said springs directly contacts said dog-leg of said leads to urge said semiconductor devices in an upright position on said carrier.

3. The carrier defined in claim 1 and in which the leads of said devices are dog-legged and are generally rectilinear in cross-section, said springs having an upper surface for seating said package of said device.

4. A carrier for multi-lead semiconductor devices for attachment of said devices to a printed circuit board comprising a block like unit of plastics material having a base portion, and having a attachment means associated therewith for attachment of said carrier in a predetermined position on the printed circuit board, said base portion having a plurality of guide openings extending therethrough which have exits that align with openings formed through the printed circuit board that are adapted to receive the leads of the semiconductor device, said carrier having a plurality of laterally spaced retainers and positioning block means extending upwardly from said base portion, said retainer and positioning block means having forward stop faces for engaging said semiconductor devices to retain them in an upright position, said positining block means further having laterally spaced sides to define guide walls therebetween and inclined guide ramp means therebetween that extend from an entrance edge and extend downward at a predetermined angle to a terminal end leading into said openings so that said laterally spaced sides and ramp means guide the leads of the semiconductor device into said openings and into the printed circuit board, spring means associated with said carrier to hold the semiconductor device at a predetermined position against said forward stop faces of said positioning block means.

5. A carrier for a plurality of semiconductor devices each having a generally rectilinear package with a plurality of leads extending therefrom, said carrier having a locating and locking means for attachment to a printed circuit board and for guiding said leads through lead openings through said circuit board for subsequent operative attachment thereto, said carrier comprising a base portion having lower and upper surfaces and plurality of laterally spaced openings extending from a bottom surface to a upper surface, said base portion further having a plurality of load springs hinged to said lower surface of said base position which extend upwardly from said base portion for holding a wide range of sizes of said semiconductor devices to said carrier and a plurality of laterally spaced guide blocks extending from said upper surface of said base portion which having facing sides with an inclined plane therebetween, said inclined plane having a lower edge that leads toward said spaced openings at said lower surface of said base portion, said guide blocks having a facing stop surface so that a semiconductor device having an upper package and a plurality of leads depending therefrom can be guided between said blocks and down the ramps with the leads guided thereby into said holes for subsequent insertion through the corresponding holes of the printed circuit board and load spring means associated with said carrier load for brazing the transistor package against the stop surfaces of said guide blocks.

6. A method of assembling semiconductor devices to a circuit board comprising the steps of:

inserting a carrier for said semiconductor devices in a predetermined position onto a printed circuit board so that guide walls formed between a plurality of guide walls align the leads of said device guide openings formed in said carrier and align with semiconductor lead openings formed in said board;

placing a semiconductor so that the leads thereof are between said guide walls of said carrier;

swinging said semiconductor in a first direction of rotation until said leads enter guide holes formed in said carrier;

urging said semiconductor in a direction toward said board until said leads extend through said openings in said board;

urging said semiconductor into an upright position, providing a spring associated with said carrier to hold said device in a predetermined position with respect to said carrier and said board; and soldering said leads of said semiconductor device into an operative position on said board.

7. A method of assembling semiconductor devices having an upper package and a plurality of leads to connect to a circuit board comprising the steps of:

inserting a carrier for semiconductors onto a printed circuit board;

placing a semiconductor device so that the leads thereof are between guide walls provided by said carrier;

swinging said semiconductor in a first direction of rotation until said leads enter guide holes formed in said carrier;

urging said semiconductor device in a direction toward said board until said leads extend through said openings in said board;

urging said semiconductor device into a predetermined position with a spring having against said carrier; and soldering said semiconductor device into an operative position on said board.

* * * * *